United States Patent [19]

Saito et al.

[11] Patent Number: 4,521,393
[45] Date of Patent: Jun. 4, 1985

[54] METHOD OF MANUFACTURING β TYPE SILICON NITRIDE WHISKERS

[75] Inventors: Hajime Saito, 1088-193, Aza-Hirago, Ohaza-Fujieda, Nisshin-Cho, Aichi-Gun, Aichi Pref.; Tetsuro Urakawa, Kariya, both of Japan

[73] Assignees: Toshiba Ceramics Co. Limited, Tokyo; Hajime Saito, Aichi, both of Japan

[21] Appl. No.: 624,702

[22] Filed: Jun. 26, 1984

[30] Foreign Application Priority Data

Apr. 18, 1984 [JP] Japan .................................. 59-76450

[51] Int. Cl.$^3$ ............................................ C01B 21/068
[52] U.S. Cl. ..................................... 423/344; 423/406
[58] Field of Search ................................. 423/344, 406

[56] References Cited

U.S. PATENT DOCUMENTS

| 3,244,480 | 4/1966 | Johnson et al. | 423/344 |
| 3,394,991 | 7/1968 | Evans | 423/344 X |
| 3,413,090 | 1/1968 | Krock et al. | 423/344 X |
| 4,122,152 | 10/1978 | Mori et al. | 423/344 |
| 4,428,916 | 1/1984 | Komeya et al. | 423/344 |

FOREIGN PATENT DOCUMENTS

| 0080050 | 1/1983 | European Pat. Off. | 423/344 |
| 49-45000 | 4/1974 | Japan | 423/344 |
| 49-27755 | 7/1974 | Japan | 423/344 |
| 51-12320 | 4/1976 | Japan . | |
| 54-25299 | 2/1979 | Japan | 423/344 |
| 57-17499 | 1/1982 | Japan | 423/344 |

*Primary Examiner*—Jack Cooper
*Attorney, Agent, or Firm*—Spencer & Frank

[57] ABSTRACT

Silicon nitride whiskers having a long fiber length in which β type silicon nitride is well developed are produced by reacting a mixture of silica, carbon and cryolite in the specific molar ratio in a mixed gas atmosphere of $N_2$ and $NH_3$ by heating the mixture at a temperature of 1,250°–1,450° C. Kira of a ceramic industry waste may be used in place of silica and in this case $N_2$ alone is used as a nitriding atmosphere.

9 Claims, 1 Drawing Figure

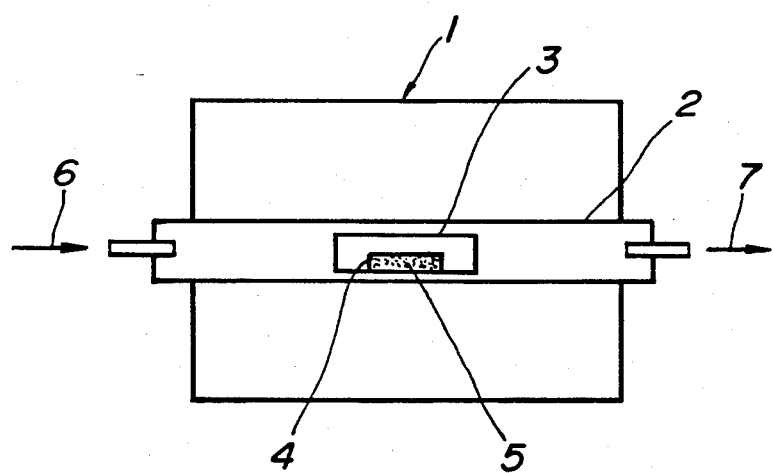
FIG_1

METHOD OF MANUFACTURING β TYPE SILICON NITRIDE WHISKERS

BACKGROUND OF THE INVENTION (1) Field of the Invention

The present invention relates to a method of manufacturing β type silicon nitride whiskers, and particularly to a method of manufacturing β type silicon nitride whiskers by which well developed β type silicon nitride whiskers having a long fiber length can be easily produced at a relatively low temperature of 1,250°–1,450° C.

(2) Description of the Prior Art

In general, the application of β type silicon nitride whiskers has been eagerly expected as a fiber reinforcement for a composite material because of excellent high temperature strength and thermal shock resistance of silicon nitride.

As the prior techniques relating to the present invention, there are the following methods, but they are quite different from the present invention for the reasons also stated below. Therefore, the invention cannot easily be inferred therefrom. The invention is to provide a method of commercially advantageously producing β type silicon nitride whiskers.

(A) Japanese Patent Application Publication No. 12,320/1976 "A Method of Manufacturing Silicon Nitride"

This reference is similar to the present invention in view of addition of a fluoride to a mixture of silica and carbon and in the composition thereof, but is different from the present invention in a way of adding the fluoride. Further, this reference is completely silent about the molar ratio of silica, carbon and cryolite, and it also fails to refer to the crystal type of the whiskers.

(B) Japanese Patent Application Publication No. 21,160/1975 "A Method of Manufacturing Fibrous Silicon Nitride Crystals"

This is quite different from the present invention in that silicon is used as the source of Si of silicon nitride.

(C) Japanese Patent Application Publication No. 4,480/1975 "A Method of Manufacturing Silicon Nitride Fibers"

This reference uses a metal additive as a catalyst of the nitriding reaction, and therefore it quite differs from the present invention. This reference is utterly silent about the crystal form of the obtained whiskers.

(D) Japanese Patent Application Publication No. 27,755/1974 "A Method of Manufacturing Silicon Nitride Whiskers"

This reference adds Cl component in $N_2$ atmosphere, and therefore it differs from the present invention. Further, it does not to the crystal form of the produced whiskers at all.

Briefly speaking, there have been conventionally known the following methods as the method of manufacturing the silicon nitride whisker.

(a) Direct nitriding of metallic silicon powder.

(b) Catalytic reaction of silicon halide with ammonia.

(c) In a silica reduction method, a fluoride or chlorine component is added, and silica is reacted with $N_2$ gas.

According to the methods (a) and (b), merely powdery whiskers having a short fiber length can be obtained. According to the method of (c), although the whiskers of a slightly longer fiber length can be obtained, the structure is mainly of α type when the treating temperature is a relatively low temperature of 1,300° to 1,400° C.

In the conventional techniques, a problem is the phase transition of $Si_3N_4$ in the case that the $Si_3N_4$ whiskers are mixed into $Si_3N_4$ powder, and are used as a reinforcement of the $Si_3N_4$ sintered body. $Si_3N_4$ has two crystal phase, α type and β type, which belong to the hexagonal system. The dimension of crystal lattices of both the crystal types is that $a_o=7.76$ Å and $c_o=5.62$ Å in the case of the α type, while $a_o=7.61$ Å and $c_o=2.91$ Å in the case of the β type. The dimension of the crystal lattice in the c-axis direction is largely different between the α type and the β type. β is a high temperature phase which is changed from the α type at about 1,400°–1,600° C. The α type $Si_3N_4$ powder having a high purity and a high sinterability is suitable for the raw material of the $Si_3N_4$ sintered body. This material is considered to impart a high strength to the sintered body through phase transition from the α type to the β type in the course of sintering. It is reported that when $Si_3N_4$ whiskers abundant in the α type are added to such an α type $Si_3N_4$ powder and the mixture is sintered, the whiskers themselves undergo the phase transition in the course of the sintering, so that the strain is caused between matrices to lower the strength of the sintered body. It is considered that the influence of the phase transition of the $Si_3N_4$ whiskers similarly occurs in the case of the reinforcing of a sintered body other than $Si_3N_4$. Thus, it has been long demanded to develop a method of manufacturing $Si_3N_4$ whiskers composed mainly of the β type.

SUMMARY OF THE INVENTION

In view of the above circumstances, upon strenuously having made studies, the present inventors have accomplished the invention. That is, it is therefore an object of the present invention to provide a method of manufacturing a well developed β type $Si_3N_4$ whiskers of a long fiber length at a relatively low temperature, for instance, 1,250°–1,450° C.

It is another object of the present invention to provide a cheap method of manufacturing a well developed β type $Si_3N_4$ whiskers of a long fiber length at a relatively low temperature, for instance, 1,250°–1,450° C. using Kira as industrial waste.

According to the method of manufacturing the β type silicon nitride whiskers in the present invention, a mixture of silica, carbon and cryolite in a molar ratio of $1:(2\sim10):(1/12\sim\frac{1}{4})$ is heated, at a relatively low temperature of 1,250°–1,450° C. in a mixture atmosphere of $N_2+NH_3$, a molar ratio of $NH_3$ to $N_2$ being not higher than 1/5.

According to the second aspect of the present invention, there is a provision of a method of cheaply manufacturing β type silicon nitride whiskers having a long fiber length by heating a mixture of silica contained in Kira, carbon, and cryolite in a molar ratio of $1:(3\sim13):(1/12\sim1)$, at a temperature of 1,250°–1,450° C. in an $N_2$ gas atmosphere.

These and other objects, features and advantages of the present invention will be well appreciated upon reading of the following description of the invention when taken in connection with the appended claims and the attached drawings with understanding that some modifications, variations and changes could be easily made by the skilled in the art to which the invention pertains without departing from the spirit of the invention and the scope of the claims.

BRIEF DESCRIPTION OF THE DRAWING

FIG. 1 is a schematically sectional view of a device used in carrying out a process according to the present invention.

DESCRIPTION OF THE PREFERRED EMBODIMENTS

The production reaction of silicon nitride ($Si_3N_4$) whiskers according to a silica reduction process using $N_2$ gas is shown by the following two formulae:

$$SiO_2(solid) + C(solid) \rightarrow SiO(gas) + CO(gas) \ldots \quad (1)$$

$$3SiO(gas) + 2N_2(gas) + 3CO(gas) \rightarrow Si_3N_4(solid) + 3CO_2(gas) \ldots \quad (2)$$

The inventors have found that $\beta$ type $Si_3N_4$ whiskers can be manufactured at a relatively low temperature by reacting silica with carbon in the presence of cryolite in $N_2$ atmosphere to which a small amount of $NH_3$ is added.

Since the reaction in the formula (1) is a solid reaction between $SiO_2$ and C, the reaction rate is slow. When cryolite is present in the reaction between $SiO_2$ and C, however, $SiO_2$ is changed to a silicate fused body by the action of this flux, which results in the reaction between the liquid and the solid C and is represented by the following formula (3):

$$SiO_2(silicate, liquid) + C(solid) \rightarrow SiO(gas) + CO(gas) \quad (3)$$

The reaction rate of this reaction is far promoted as compared with the conventional solid reaction and the production of the SiO is extremely activated.

Meanwhile, when $NH_3$ is added to the reaction atmosphere, gaseous SiO produced in the formula (3) reacts according to the following formula (4) due to a powerful reducing action of $H_2$ gas generated through thermal decomposition of $NH_3$.

$$SiO(gas) + H_2(gas) \rightarrow Si(gas) + H_2O(gas) \ldots \quad (4)$$

The thus produced Si (gas) reacts with $N_2$ to produce crystal nuclei of $\beta$ type $Si_3N_4$ according to the following formula (5):

$$3Si(gas) + 2N_2(gas) \rightarrow Si_3N_4(solid) \ldots \quad (5)$$

It is in conformity with the ordinary crystal growth theory that the crystal nuclei of $\beta$ type $Si_3N_4$ thus formed grow as the $\beta$ type crystals even under conditions where the $\alpha$ type crystals are produced according to the reaction (2).

Therefore, the production of the $\beta$ type $Si_3N_4$ whiskers proceeds according to the reactions (4), (5) and (2). It is a question why the $\beta$ type $Si_3N_4$ is produced according to the reaction (5) although when a single crystal of Si is heated and converted to Si vapor, which is reacted with $N_2$ gas, $\alpha$ type $Si_3N_4$ is produced. This is because Si vapor obtained through reduction of SiO under heating is different in physical properties from that obtained by heating the Si single crystal. This may be illustrated by the similar phenomenon in the case where a single crystal is produced from a fused body as another embodiment in which a single crystal containing $Fe^{II}$ cannot be obtained from a fused body in which the starting material is $Fe^{II}$, while a single crystal containing $Fe^{II}$ can be obtained from a fused body obtained by reducing a starting material of $Fe^{III}$ at a high temperature into $Fe^{II}$ and this is based on the difference of the physical properties of both $Fe^{II}$. This is due to the difference in the activity and the ion radius and in this case, in order to reduce the strain of the crystals, the $\beta$ type product having a smaller $c_o$ value is produced. Further, in this case, the reaction (2) may independently take place depending upon the reaction conditions to produce the $\alpha$ type product simultaneously.

According to the invention, the mixing ratio of silica to carbon is 1:2 to 1:10, preferably about 1:4 in a molar ratio. If the molar ratio of carbon is lower than the above range, the reaction (1) is difficult to proceed, while on the contrary, when it exceeds the above range, the amount of unreacted carbon residue increases, and the reaction yield unfavorably lowers.

The mixing ratio of silica to cryolite cannot be definitively determined because the synergistic effects of the cryolite and $NH_3$ added in the nitrogen atmosphere is remarkable, but is preferably about $1:1/12-1:\frac{1}{4}$ in a molar ratio of $SiO_2:Na_3AlF_6$. When the molar ratio of $N_2$ to $NH_3$ in the mixed atmosphere ($N_2+NH_3$) is 24:1, the ratio of $SiO_2$ to $Na_3AlF_6$ is more preferred to be $1:1/10-1:1/6$. If the amount of cryolite is more than the above range, the amount of fused silicate formed in the reaction is too much, so that the flowing movement of $N_2$ gas and SiO gas is interrupted. Thereby, the reactions (4) and (5) are difficult to proceed and SiC is unfavorably formed in the residue. Reversely, when it is less than the above range, the reaction (3) is retarded and the unreacted $SiO_2$ is unfavorably formed in the residue. The mixing ratio of $NH_3$ to $N_2$ is preferably not higher than 1/5, more preferably not higher than 1/12 in a molar ratio. If the mixing ratio exceeds 1/5, the partial pressure of $N_2$ in the mixing gas atmosphere is too lower and a large amount of SiC is likely to be unfavorably produced in the residue. In the case of $N_2$ gas alone, $\alpha$ type $Si_3N_4$ whiskers are likely to be produced and no $\beta$ type $Si_3N_4$ whiskers are obtained.

As mentioned above, an appropriate amount of $NH_3$ and cryolite are indispensable for the present invention.

The reaction temperature is 1,250°–1,450° C. If the temperature is lower than 1,250° C., the reaction is difficult to proceed and the yield is extremely low. On the other hand, if it exceeds 1,450° C., no silicon nitride is produced and silicon carbide is produced instead. The reaction temperature is preferably 1,300°–1,500° C.

The inventors have found that Kira of ceramic industry waste can be used in place of silica which is the raw material in the above described method.

The term "Kira" used herein means a residue obtained by elutriating a raw loam for ceramics to remove clay and quartz and which are used for a ceramic raw material. Kira has a particle distribution of about 5–40μ and a chemical composition of around 80% of $SiO_2$, around 10% of $Al_2O_3$, and slight amounts of others such as $Fe_2O_3$, $K_2O$, $Na_2O$ and consists mainly of crystal, feldspar, kaolinite and mica. This Kira is so far low in practical value and is produced in a large amount. Discharge or discard of such a large amount of Kira into rivers leads to public nuisance, so that the disposal thereof now comes into a problem, and therefore the investigation on the utilization of this industrial waste has been strongly demanded.

Thus, the second aspect of the present invention is to provide a method of cheaply manufacturing $\beta$ type silicon nitride whiskers having a long fiber length by effectively using cheap Kira of the industrial waste without using the expansive silica source. Silica particles in Kira are high in the reactivity and contain $Al_2O_3$, $Fe_2O_3$, $K_2O$, $Na_2O$, etc. and are easily fused.

Thus, the second aspect of the present invention has been accomplished by utilizing such properties and is to provide a method of cheaply manufacturing β type silicon nitride whiskers having a long fiber length by heating a mixture of silica in Kira, carbon, and cryolite in a molar ratio of 1:(3~13):(1/12~1), at a temperature of 1,250°–1,450° C. in an $N_2$ gas atmosphere.

The mixing ratio of silica contained in Kira to carbon is 1:3 to 1:13, preferably, around 1:8 in a molar ratio. As mentioned in the above first process, if the molar ratio of carbon is lower than the above range, the reaction (1) is difficult to proceed, while on the contrary, when it exceeds the above range, the amount of unreacted carbon residue increases, and the reaction yield unfavorably drops. The reason why the molar ratio of carbon is larger in this case than in the case where silica itself is used as a raw material is that a part of carbon is consumed in the reduction reaction of impurity oxides.

The molar ratio of silica to cryolite is in a range of 1:(1/12~1), preferably around 1:⅛. If the amount of cryolite is more than the above range, the amount of the silicate fused body produced in the reaction becomes too much, so that the partial pressure of fluorine in the gas phase becomes high and the partial pressure of SiO reversely becomes too low, so that the efficiency lowers. Reversely, when cryolite is less than the above range, the formation of the fused body is difficult and the reaction rate becomes slow and the efficiency lowers.

The reason why the molar ratio of cryolite is larger in this case than in the case where silica itself is used as the raw material is that a part of the cryolite is consumed in the reaction with the impurity oxides as in the case of carbon.

The reaction temperature is the same as in the case of using itself as mentioned above.

The present invention will be explained more in detail with reference to Examples in comparison with Comparative Examples. These Examples are merely illustrative of the invention, and are never interpreted to limit the scope of the invention.

EXAMPLES USING SILICA

Silicate anhydride (silica), activated carbon and cryolite each being powder passing through 100 meshes were dry-mixed with one another in molar ratios as shown in the following Table to obtain a sample material 5. 1 g of each of the mixed raw material samples 5 was charged into a vessel 4 made of carbon as shown in FIG. 1, which was then placed into a protection tube 3 made of mullite. This mullite tube was placed into an electric furnace 1 using a furnace core tube 2. While a mixed gas 6 of $N_2$ and $NH_3$ having a molar ratio as shown in the following Table was introduced into the furnace core tube 2 in a direction shown by the arrow in FIG. 1, the reaction was effected in the atmosphere of $N_2+NH_3$ at a temperature of 1,350° C. for 24 hours under heating. On the other hand, while an exhaust gas 7 was exhausted in a direction shown by the arrow in FIG. 1. In this case, the flow rate of the introduced mixed atmosphere gas 6 was 50 cc/min, and the reaction was effected while the pressure of the interior of the furnace core tube 2 was kept at about atmospheric pressure. The silicon nitride whiskers produced on the inner surface of the protection tube 3 was observed by X-ray diffraction. The contents (weight %) of α phase and β phase are also shown in the following Table 1.

TABLE 1

| | | Comparative Example 1 | Example 1 | Comparative Example 2 | Example 2 | Example 3 | Example 4 | Comparative Example 3 | Comparative Example 4 | Example 5 | Comparative Example 5 |
|---|---|---|---|---|---|---|---|---|---|---|---|
| Raw material (molar ratio) | Silica | 1 | 1 | 1 | 1 | 1 | 1 | 1 | 1 | 1 | 1 |
| | Carbon | 4 | 4 | 4 | 4 | 4 | 4 | 4 | 4 | 4 | 4 |
| | Cryolite | 1/26 | 1/10 | 1/6 | 1/6 | 1/6 | 1/6 | 1/6 | 1/6 | ⅛ | ⅛ |
| Atmosphere gas | $N_2$:$NH_3$ (molar ratio) | 24:1 | 24:1 | $N_2$ alone | 48:1 | 24:1 | 17:1 | 3:1 | 1:1 | 24:1 | 24:1 |
| Whisker | α type | 50% | 10% | 40% | 20% | 5% | 15% | β'-cyalone SiC produced | β'-cyalone SiC produced | 10% | β'-cyalone SiC produced |
| | β type | 50% | 90% | 60% | 80% | 95% | 85% | | | 90% | |

As apparent from the above Table, the amount of cryolite in the raw material 5 in Comparative Examples 1 and 5 is outside the range in the method according to the present invention, and these Comparative Examples are unfavorable in that the content of the α type silicon nitride whiskers is high or β' cyalone ($Si_{6-z}Al_zO_zN_{8-z}$: $1 \leq z \leq 4$), and SiC are produced.

In Comparative Examples 2 to 4, the molar ratio of $N_2+NH_3$ in the mixed atmosphere gas 6 was outside the range of the present invention. They are no good in that the content of the α type silicon nitride whiskers is high, or β' cyalone and SiC are produced.

On the other hand, in any of Examples 1–5 of the method according to the present invention, well developed β type silicon nitride whiskers having a high purity, a content of the β type silicon nitride of not lower than 80%, a diameter of 0.2–1.5μ and a length of about 5 mm in the average were obtained. Namely, the conspicuous effects of the present invention can be observed in these Examples.

As mentioned above, according to the present invention, there is provided a method of easily manufacturing the flexible and well developed β type silicon nitride whiskers having a long fiber length at a relatively low temperature.

EXAMPLE USING KIRA

Powders of Kira, carbon and cryolite were dry-mixed in the molar ratios shown in Tables 2 and 3. Kira is represented by $SiO_2$ contained therein.

1 g of the mixture raw material 5 in FIG. 1 was charged into a vessel 4, made of carbon, which was placed in a protection tube 3 made of mullite. This protection tube was then placed into an electric furnace 1 using a mullite tube as a furnace core tube 2.

TABLE 2

| Sample No. | SiO$_2$:C:Na$_3$AlF$_6$ | (1,350° C.) Yield (%) |
|---|---|---|
| 1 | 1:4:1/3 | 3.6 |
| 2 | 1:5:1/3 | 10.7 |
| 3 | 1:6:1/3 | 23.1 |
| 4 | 1:7:1/3 | 22.8 |
| 5 | 1:8:1/3 | 27.0 |
| 6 | 1:10:1/3 | 19.8 |

TABLE 3

| Sample No. | SiO$_2$:C:Na$_3$AlF$_6$ | (1,350° C.) Yield (%) |
|---|---|---|
| 7 | 1:8:1/12 | 4.8 |
| 8 | 1:8:1/6 | 18.3 |
| 9 | 1:8:1/3 | 27.0 |
| 10 | 1:8:1/1 | 11.2 |

The mixture of silica in Kira, carbon and cryolite in a molar ratio of 1:8:⅓ was prepared and reacted at various temperatures as shown in the following Table 4 and the obtained yield is shown in said Table.

TABLE 4

| Sample No. | Temperature (°C.) | (1:8:1/3) Yield (%) |
|---|---|---|
| 11 | 1,250 | 5.2 |
| 12 | 1,300 | 14.3 |
| 13 | 1,350 | 27.0 |
| 14 | 1,400 | 13.2 |
| 15 | 1,450 | 7.4 |

Reaction was carried out under heating at a temperature of 1,350° C. for 24 hours while flowing N$_2$ gas 6 into the furnace core tube 2 from the arrow direction in FIG. 1.

Meanwhile, the waste gas 7 was discharged as shown by the arrow in FIG. 1. N$_2$ gas was flowed at a flow rate of 75 cc/min under atmospheric pressure. The silicon nitride whiskers formed in the inner surface of the protection tube 3 was examined through X-ray diffraction, and it was revealed that they were composed substantially of β phase containing a slight amount of α phase.

As mentioned above, according to the present invention, the β type silicon nitride whiskers can be manufacture at a high yield by using a cheap Kira as an industrial waste.

What is claimed is:

1. A method of manufacturing β type silicon nitride whiskers, which comprises preparing a mixture of silica, carbon, and cryolite in a molar ratio of 1:(2~10):(1/12~⅓), reacting said mixture in a mixed gas atmosphere of N$_2$ and NH$_3$ obtained by adding NH$_3$ to N$_2$, in a molar ratio of not higher than 1/5 based on N$_2$ by heating the mixture at a temperature of 1,250°–1,450° C., said NH$_3$ being present in an amount sufficient to effect a higher content of β type silicon nitride than that produced by said method in the absence of NH$_3$.

2. The method according to claim 1, wherein the molar ratio of silica to carbon (SiO$_2$:C) is about 1:4.

3. The method according to claim 1, wherein the molar ratio of silica to cryolite (SiO$_2$:Na$_3$AlF$_6$) is 1:1/10~1/6.

4. The method according to claim 1, wherein the molar ratio of NH$_3$ to N$_2$ is not higher than 1/12.

5. The method according to claim 1, wherein the reaction temperature is 1,300°–1,400° C.

6. A method of manufacturing β type silicon nitride whiskers by using Kira as a silica source, which comprises preparing a mixture of Kira, carbon and cryolite in a molar ratio of silica contained in Kira, carbon, and cryolite of 1:(3~13):(1/12~1), reacting the mixture in an atmosphere of N$_2$ gas by heating the mixture at a temperature of 1,250°–1,450° C.

7. The method according to claim 6, wherein the molar ratio of silica to carbon is approximately 1:8.

8. The method according to claim 6, wherein the molar ratio of silica to cryolite is approximately 1:⅓.

9. The method according to claim 6, wherein the reaction temperature is approximately 1,350° C.

* * * * *